US008921686B2

(12) United States Patent
Zuniga et al.

(10) Patent No.: US 8,921,686 B2
(45) Date of Patent: Dec. 30, 2014

(54) BACK-CONTACT PHOTOVOLTAIC CELL COMPRISING A THIN LAMINA HAVING A SUPERSTRATE RECEIVER ELEMENT

(75) Inventors: Steven M. Zuniga, Soquel, CA (US); Christopher J. Petti, Mountain View, CA (US); Gopal Prabhu, San Jose, CA (US)

(73) Assignee: GTAT Corporation, Merrimack, NH (US)

( * ) Notice: Subject to any disclaimer, the term of this patent is extended or adjusted under 35 U.S.C. 154(b) by 104 days.

(21) Appl. No.: 13/425,870

(22) Filed: Mar. 21, 2012

(65) Prior Publication Data
US 2012/0192935 A1 Aug. 2, 2012

Related U.S. Application Data

(63) Continuation-in-part of application No. 12/403,187, filed on Mar. 12, 2009, now abandoned.

(51) Int. Cl.
| | | |
|---|---|---|
| *H01L 31/00* | (2006.01) | |
| *H01L 31/02* | (2006.01) | |
| *H01L 21/04* | (2006.01) | |
| *H01L 27/142* | (2014.01) | |
| *H01L 31/0392* | (2006.01) | |
| *H01L 31/042* | (2014.01) | |
| *H01L 31/18* | (2006.01) | |

(52) U.S. Cl.
CPC ...... *H01L 27/1423* (2013.01); *H01L 31/03921* (2013.01); *H01L 31/042* (2013.01); *H01L 31/1804* (2013.01); *H01L 31/1896* (2013.01)
USPC .............. 136/252; 136/255; 136/261; 438/68

(58) Field of Classification Search
USPC ......................................................... 136/261
See application file for complete search history.

(56) References Cited

U.S. PATENT DOCUMENTS

| | | | |
|---|---|---|---|
| 4,162,505 | A | 7/1979 | Hanak |
| 5,374,564 | A | 12/1994 | Bruel |
| 6,146,979 | A | 11/2000 | Henley et al. |

(Continued)

FOREIGN PATENT DOCUMENTS

KR 20090057435 A 6/2009

OTHER PUBLICATIONS

D.S.Kim, V. Meemongkolkiat, A. Ebong, B. Rounsaville, V. Upadhyaya, A.Das and A. Rohatgi, "2D-Modeling and Development of Interdigitated Back Contact Solar Cells on Low-Cost Substrates," Proceedings of the 4th IEEE World Conference on Photovoltaic Energy Conversion, May 7-12, 2006, Waikoloa, Hawaii.

(Continued)

*Primary Examiner* — James Lin
*Assistant Examiner* — Dujuan Horton
(74) *Attorney, Agent, or Firm* — The Mueller Law Office, P.C.

(57) ABSTRACT

A method to fabricate a photovoltaic device includes forming first and second contact regions at the first surface of a semiconductor donor body. A cleave plane may be formed by implanting ions into the donor body, and a lamina that includes the contact regions is cleaved from the donor body at the cleave plane. The first surface of the lamina may be contacted with a temporary support and fabricated into a photovoltaic device, wherein the lamina comprises the base of the photovoltaic device.

10 Claims, 10 Drawing Sheets

(56) References Cited

U.S. PATENT DOCUMENTS

| | | |
|---|---|---|
| 6,468,884 B2 | 10/2002 | Miyake et al. |
| 7,339,110 B1 | 3/2008 | Mulligan et al. |
| 7,633,006 B1 | 12/2009 | Swanson |
| 7,820,475 B2 | 10/2010 | De Ceuster et al. |
| 2006/0076590 A1 | 4/2006 | Pain et al. |
| 2007/0169808 A1 | 7/2007 | Kherani et al. |
| 2007/0277874 A1 | 12/2007 | Dawson-Elli et al. |
| 2008/0070340 A1 | 3/2008 | Borrelli et al. |
| 2008/0078444 A1* | 4/2008 | Atanackovic ............... 136/256 |
| 2008/0092944 A1 | 4/2008 | Rubin |
| 2009/0007960 A1 | 1/2009 | Ito et al. |
| 2009/0194162 A1 | 8/2009 | Sivaram et al. |
| 2009/0298260 A1 | 12/2009 | Zhu et al. |
| 2010/0032007 A1 | 2/2010 | Hilali et al. |
| 2010/0139755 A1 | 6/2010 | Petti et al. |
| 2010/0240169 A1 | 9/2010 | Petti et al. |

OTHER PUBLICATIONS

Lu, Meijun et al., "Interdigitated back contact silicon heterojunction solar cell and the effect of front surface passivation," Applied Physics Letters 91, 063507, 2007.

Van Kerschaver, Emmanuel and Guy Beaucarne, "Back-contact Solar Cells: A Review," Prog. Photovolt: Res. Appl. 2006; 14:107-123.

International Search Report and Written Opinion dated May 27, 2013 for PCT Application No. PCT/US2013/024684.

* cited by examiner

Embodiment of 12/026530

Embodiment of 12/026530

Embodiment of 12/026530

BACK-CONTACT PHOTOVOLTAIC CELL COMPRISING A THIN LAMINA HAVING A SUPERSTRATE RECEIVER ELEMENT

RELATED APPLICATIONS

This application is a continuation in part to Zuniga et al., U.S. patent Application Ser. No. 12/403,187, entitled "Back-Contact Photovoltaic Cell Comprising a Thin Lamina Having A Superstrate Receiver Element," filed on Mar. 12, 2009 now abandoned, owned by the assignee of the present application, and hereby incorporated by reference. This application is also related to Murali et al., U.S. patent application Ser. No. 13/425,877, entitled "Method for Fabricating Backside-Illuminated Sensors" filed on Mar. 21, 2012, which is hereby incorporated by reference.

BACKGROUND OF THE INVENTION

The invention relates to a photovoltaic cell electrically contacted only at its back surface, the photovoltaic cell comprising a thin semiconductor lamina.

In conventional crystalline photovoltaic cells formed from silicon wafers, the cell is generally thicker than actually required by the device. Making a thinner crystalline cell using conventional methods can be difficult, as thin wafers are prone to breakage. A photovoltaic cell includes an emitter and a base; typically one of the emitter or the base is contacted at the light-facing surface, while the other is contacted at the opposite face. As will be described, methods of forming a thin photovoltaic cell may present challenges in making electrical contact to both the light-facing and back surfaces of the photovoltaic cell.

There is a need, therefore, for a thin photovoltaic cell where electrical contact to both the emitter and base regions is readily made.

SUMMARY OF THE INVENTION

The present invention is defined by the following claims, and nothing in this section should be taken as a limitation on those claims. In some embodiments a method to fabricate a photovoltaic device comprises providing a semiconductor donor body doped with a first conductivity type, at a first concentration. A first contact region is formed at the first surface and within the semiconductor donor body, where the first contact region is doped with the first conductivity type at a second dopant concentration that is higher than the first dopant concentration. A second region is formed at the first surface and within the surface the semiconductor donor body, where the second contact region is doped with a second conductivity type. A cleave plane is formed by implanting ions into the semiconductor donor body and a lamina is cleaved from the donor body at the cleave plane, wherein in the step of cleaving the lamina forms a second surface opposite the first surface and wherein the lamina comprises the first and second contact regions. The first surface of the lamina is contacted with a temporary support and a photovoltaic device is fabricated, wherein the lamina comprises a base of the photovoltaic device and wherein, during normal operation current flows into and out of the first surface.

In some embodiments a method to fabricate a photovoltaic device comprises providing a lamina doped with a first conductivity type and having a thickness less than 50 μm. The lamina has a first and second surface. A first region is formed at the first surface and within the lamina, where the first region is doped with dopant of the first conductivity type comprising a second dopant concentration, wherein the second dopant concentration is higher than the first dopant concentration. A second region may be formed at the first surface and within the lamina, where the second region is doped with a dopant of a second conductivity type. The lamina may be contacted to a first receiver element at the second surface of the lamina, and a photovoltaic cell may be fabricated, wherein the photovoltaic cell comprises the lamina, and wherein, during normal operation of the photovoltaic cell, current flows into and out of the first surface.

The preferred aspects and embodiments will now be described with reference to the attached drawings.

DETAILED DESCRIPTION OF THE EMBODIMENTS

Figure 1:
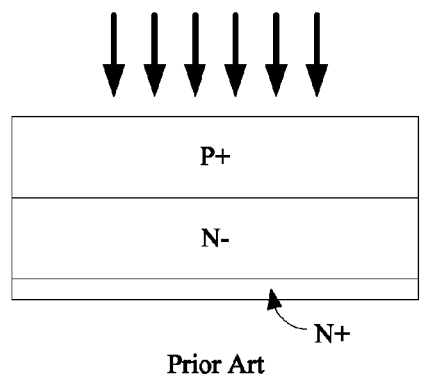
FIG. 1 is a cross-sectional view showing a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either an n−/p+ junction (as shown in FIG. 1) or a p−/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
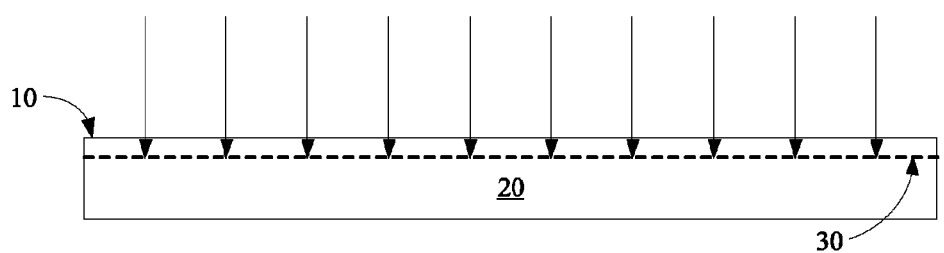
FIGS. 2a through 2c are cross-sectional views illustrating stages in formation of a photovoltaic assembly formed by the methods of Sivaram et al., U.S. patent application Ser. No. 12/026,530.
Figure 2B:
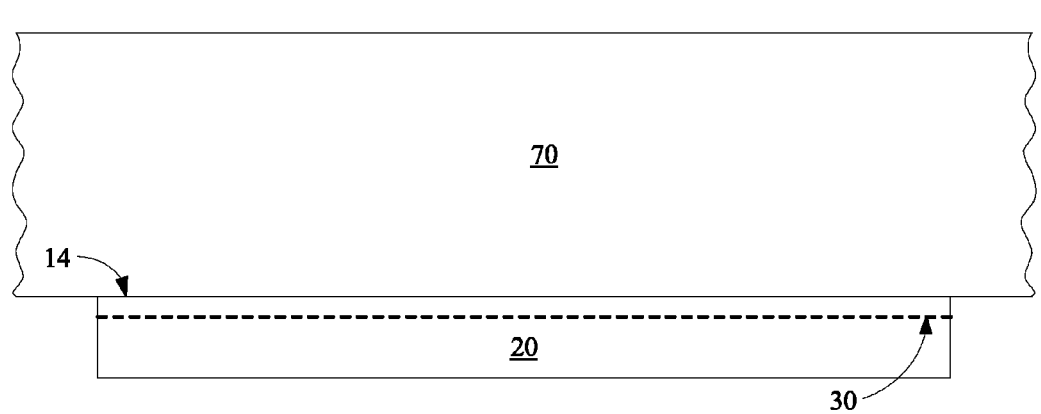
Figure 2C:
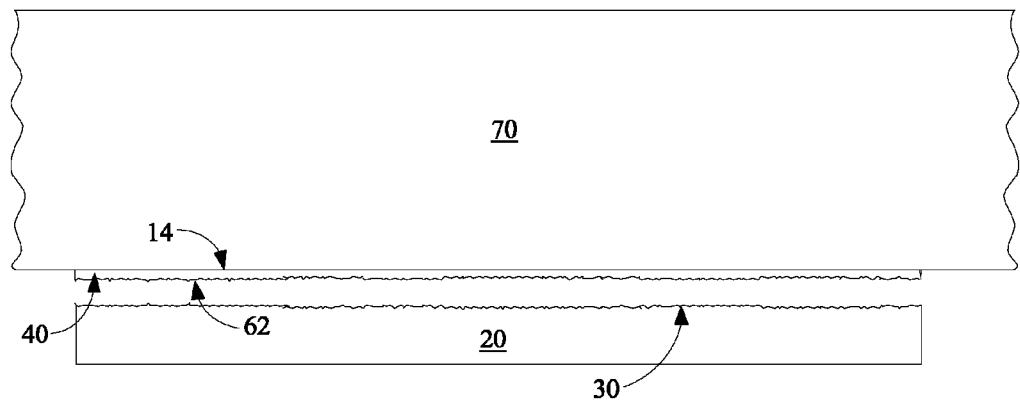

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted with one or more species of gas ions, for example hydrogen and/or helium ions. The implanted ions define a cleave plane 30 within the semiconductor donor wafer. As shown in FIG. 2b, donor wafer 20 is affixed at first surface 14 to a support element 70. In some embodiments support element 70 may be a temporary or permanent support element. Referring to FIG. 2c, an anneal reaction causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. Using the methods of Sivaram et al., rather than being formed from sliced wafers, photovoltaic cells are formed of thin semiconductor laminae without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

Once charge carriers are generated in a photovoltaic cell, they must travel to electrical contacts; minority carriers travel to one contact, while majority carriers travel to the other. As free carriers travel through the semiconductor material, they may recombine and be lost to photocurrent. In a conventional cell, like that shown in FIG. 1, with opposing faces doped to opposite conductivity types, photocurrent travels all the way through the cell, entering one face, passing through the cell, and out the opposite face. For good quality silicon, the charge carriers travel a distance on the order of tens to hundreds of microns before recombination; this distance is shorter for lower-quality silicon.

Figure 3:
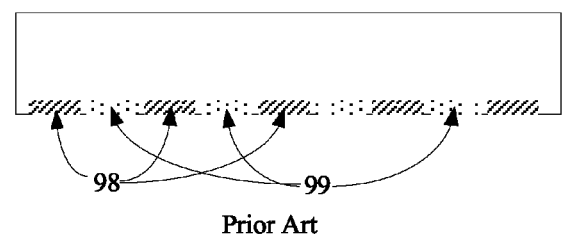
FIG. 3 is a cross-sectional view of a prior art photovoltaic cell electrically contacted only at its back surface.

In at least one known cell design, current does not pass from one face to the opposite face. In such a cell, shown in FIG. 3, both heavily doped n-type regions 98 and heavily doped p-type regions 99 are formed at the back surface. This type has an advantage in that no metallic contact to the front, light-facing, surface is needed; thus there is no disadvantageous shading of the incoming light. During operation of the cell, electrons travel toward n-type regions 98, while holes travel toward p-type regions 99. In such a cell, current passes through the back face of the cell. In this case a very thick cell is a disadvantage, because free carriers generated near the front surface of the cell are more likely to recombine before they reach the back surface, and in a solar cell, 95% of carriers generated by light from the peak of the solar spectrum (~550 nm) are generated in the first 4.5 µm of silicon. Thinner cells are fragile and therefore require a support element to stably support the cell during manufacture and use. Thus forming such a cell using the methods of Sivaram et al., which allows a cell to be formed from a thin lamina, may be particularly advantageous. This invention provides for methods supporting the thin lamina in a manner that is not impacted by methods used to create heavily doped regions with the lamina.

In a conventional photovoltaic cell, the opposing faces of the cell can be readily accessed during fabrication to form contacts. Completed cells are then mounted onto a supporting substrate or superstrate and electrically connected to form a photovoltaic module. In the methods of Sivaram et al., though, the wafer must be contacted to a support element early in the process in order to provide mechanical support to the thin lamina. Typically, lamina formed in this manner must either incorporate the support element into any resultant photovoltaic cell or engage in a debonding step to remove the support element. In some embodiments a thin, free standing lamina may be formed and separated from a donor body without adhesive or permanent bonding to a support element and without requiring debonding or cleaning steps prior to photovoltaic cell fabrication, providing for any number of processing steps to the first or second surface of a lamina. The first surface of a donor body may be placed adjacent to a support element and an anneal step may be performed that exfoliates a lamina from the first surface donor body before or after the surface is treated with a processing step. This creates a second surface and once again, any number of processing steps may then occur on either side of the exfoliated lamina. These processes may occur in the absence of a bonded support element on the lamina as described in Kell et al., "A Method and Apparatus for Forming a Thin Lamina," U.S. patent application Ser. No. 13/331,909 filed Dec. 20, 2011 and hereby incorporated by reference.

Figure 4:
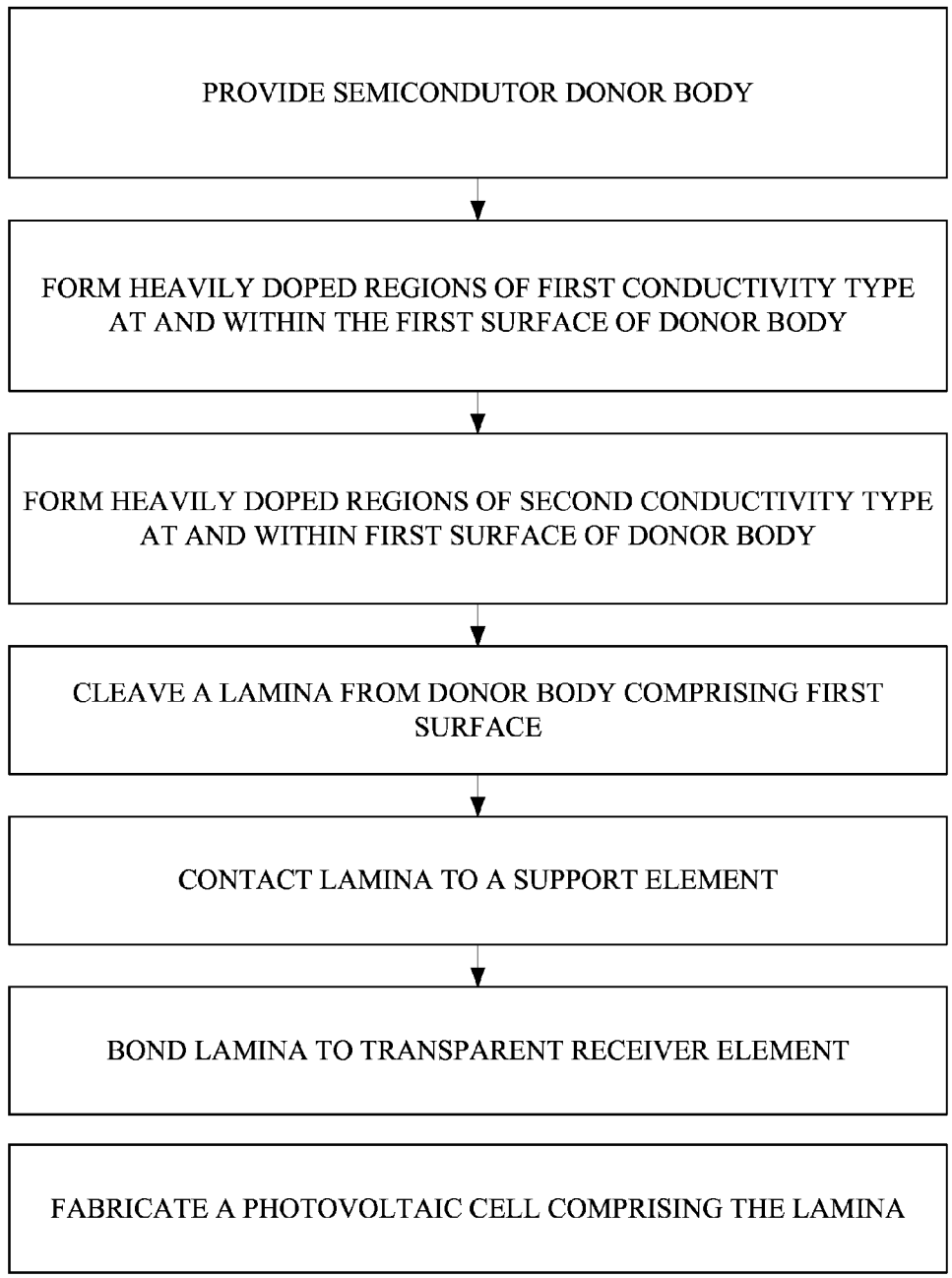
FIG. 4 is a flow diagram illustrating steps in one embodiment of the invention.

A flow diagram of an embodiment of the present invention is depicted in FIG. 4. The method of fabricating a back-contact photovoltaic cell may start with a semiconductor donor body provided with a first conductivity. A contact region of the same conductivity but at a heavily doped concentration of dopant is formed at and below a first surface of the donor body. This is the contact to the base region of the device. A region of the opposite conductivity is also formed at and below the same surface; this is the emitter region. Any method for forming the emitter and base contact regions may be used, some of which are described below. A thin semiconductor lamina may then be cleaved from the portion of the donor body having the emitter and base contact regions. Cleavage may occur by any method including methods of Sivaram et al. or Kell et al. In some embodiments, contact regions are formed before the lamina is cleaved from the donor body. This cleaving process exposes a second surface of the lamina. One aspect of the present invention is that the resultant lamina is advantageously thin enough to provide an improved substrate for a back contacted solar cell while minimizing the amount of silicon used in its manufacture. A temporary support element may then be contacted to either the first or second surface of the lamina in order to provide structural support while processing the opposite surface of the lamina. The second surface of the lamina may be bonded to a transparent receiver element and a photovoltaic cell is fabricated from the lamina. The cell has emitter and base contact regions only at the first surface of the lamina, and the transparent receiver element that is bonded to the second surface of the lamina may serve as a permanent support. In some embodiments, the lamina is bound to the transparent receiver element prior to the fabrication of a solar cell. In other embodiments, the lamina is bound to the transparent receiver element after fabrication of a solar cell. The flexibility in the order of these steps provided by this invention allows for a wider variety of process steps to be utilized in the manufacture of the solar cell assembly.

As described in the embodiment of FIG. 4 and subsequent embodiments, a photovoltaic device is fabricated from the thin lamina. The lamina may be less than 50 µm thick, such as between 1 and 20 µm or between 1 and 10 µm thick. As described, a thin lamina is well-suited as a photovoltaic cell type for this device because the thin lamina provides a minimal distance for the photo-generated carriers to travel, while the transparent receiver element provides for support for the lamina that may be fragile at these thicknesses. One aspect of this invention is that the receiver element may be contacted with the lamina after the formation of the emitter and base contact regions, thus obviating the need for a receiver material that is stable at the temperature range used in the formation of the emitter and base contact regions. The transparent receiver element can also serve as the front-side protection element in a completed photovoltaic module assembly, resulting in an economical use of materials, as a separate support element for the solar cell is not needed.

Figure 5:
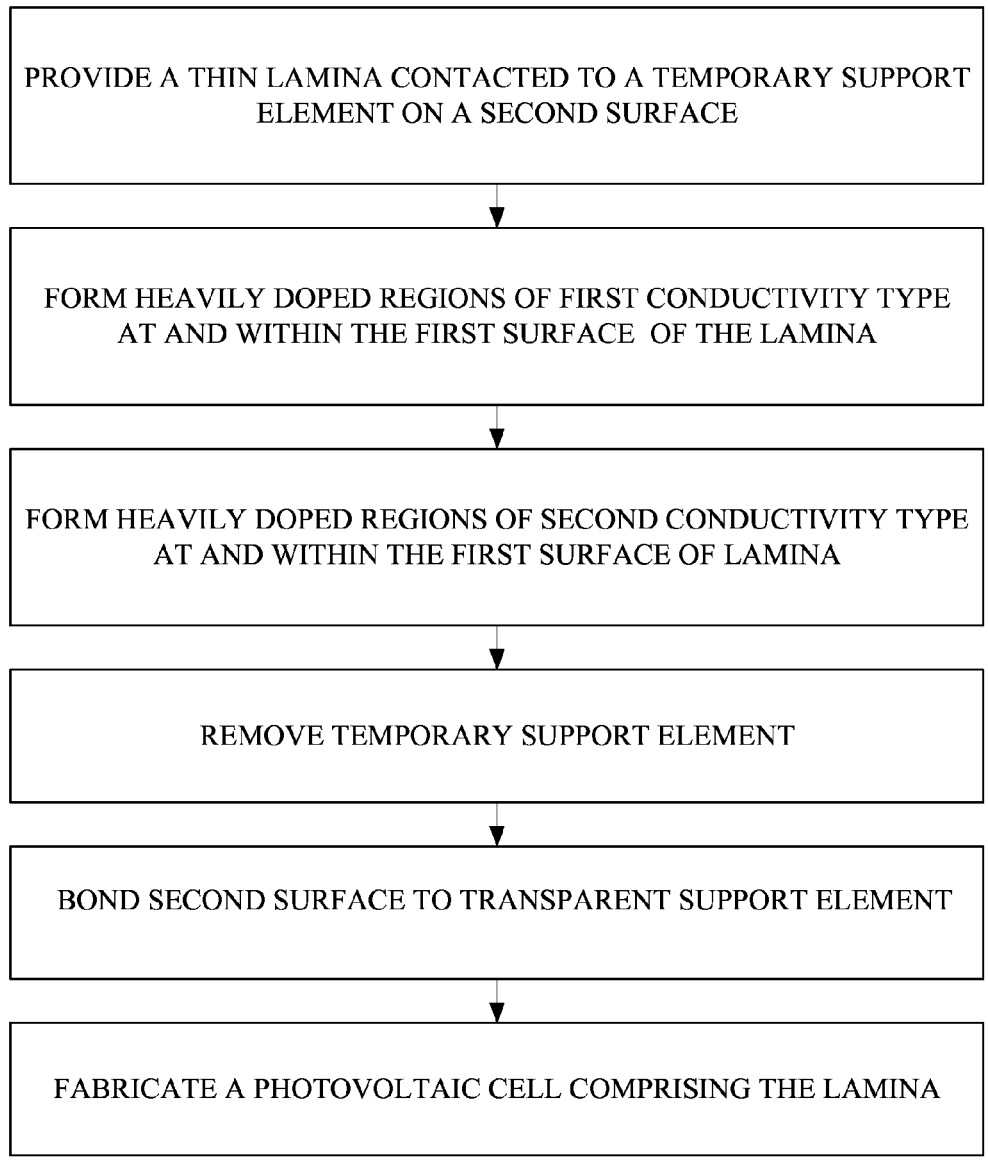
FIG. 5 is a flow diagram illustrating steps in another embodiment of the invention.

In an alternative embodiment outlined in FIG. 5, a thin semiconductor lamina is provided that is doped with a first conductivity and is already formed with a desired thickness, such as being cleaved from a donor wafer. The lamina may be provided in contact with support element on a second surface of the lamina. The support element may be a temporary support element such as an electrostatic chuck or any other device capable of withstanding conditions for forming doped contact regions in the lamina. A doped contact region of first conductivity yet higher dopant concentration than the lamina may be formed at and below the first surface of the lamina. This is the contact region to the base of the device. A contact region of opposite conductivity may be formed at and below the first surface as well. This is the device's emitter region. In an alternative embodiment, the emitter and base contact regions may be applied to the surface of the lamina in the form of discrete regions of amorphous silicon doped with the appropriate amount of dopant.

The temporary support element is removed and replaced with a permanent receiver element such as a transparent support element on the second surface of the lamina. The resultant structure is similar to the device formed by the method described in FIG. 4, and both beneficially provide for the formation of doped regions on the same side of a thin lamina prior to the contact with a permanent receiver element on the lamina. One aspect of this embodiment is the possibility to preprocess either side of the lamina prior to the formation of emitter and base contact regions on the first side of the lamina. The formation of doped regions may occur at relatively high temperatures, and the fabrication of these regions prior to subsequent steps allows for the more thermally fragile materials to be used in the fabrication of a solar cell.

Figure 10:
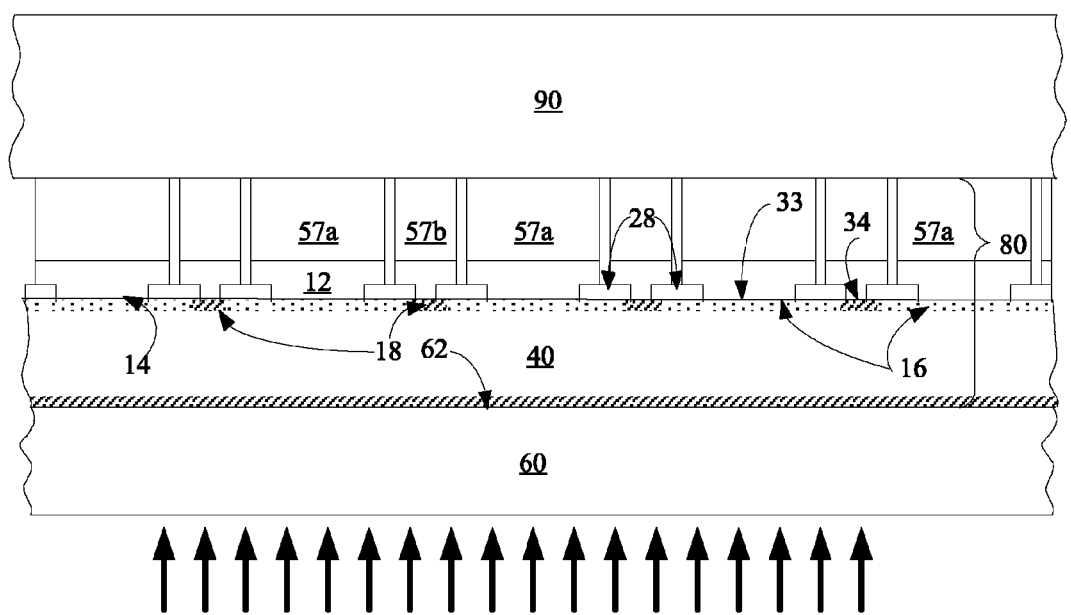
FIG. 10 is a cross-sectional view showing embodiments of the present invention.

FIG. 10 shows an exemplary completed photovoltaic assembly 80 fabricated by methods of this invention and includes a lamina 40 with emitter and base contact regions 16, 18, electrical contacts 57a, 57b, and associated components 33, 34, 12, 28 for an operable solar cell. The photovoltaic cell of the assembly includes lamina 40 that may comprise the base of a photovoltaic cell. A plurality of photovoltaic assemblies 80 can be mounted on supporting substrate 90 and electrically connected in series, forming a photovoltaic module. Alternatively, the sole support for the photovoltaic assembly may be transparent receiver element 60. In this embodiment, a photovoltaic cell is included within lamina 40. Incident light, indicated by arrows, enters lamina 40 at first surface 62, and is reflected back into lamina 40 at second surface 14. Current flows into and out of lamina 40 at first surface 14, and may optionally not pass through first surface 62.

EXAMPLE 1

The process begins with a donor body of an appropriate semiconductor material. An appropriate donor body may be a monocrystalline silicon wafer of any practical thickness, for example from about 200 to about 1000 microns thick. In alternative embodiments, the donor wafer may be thicker; maximum thickness is limited only by practicalities of wafer handling. Alternatively, wafers or ingots of other semiconductors materials, including germanium, silicon germanium, or III-V or II-VI semiconductor compounds such as GaAs, InP, etc may be used.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this disclosure will describe the use of a monocrystalline silicon wafer as the semiconductor donor body, but it will be understood that donor bodies of other types and materials can be used.

Figure 6A:
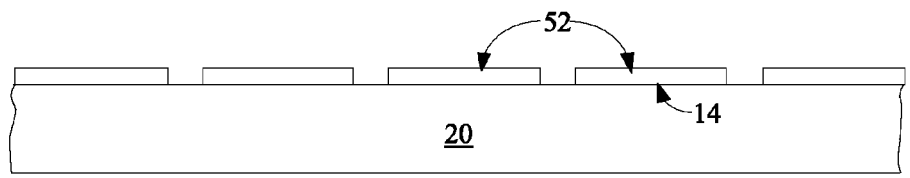
FIGS. 6a through 6c are cross sectional views illustrating stages in formation of an embodiment of the present invention.

The donor wafer of this invention may be a semiconductor material which is lightly to moderately doped to a first conductivity type. Referring to FIG. 6a, donor wafer 20 may be made of lightly doped n-type or p-type monocrystalline silicon; in this example wafer 20 is of lightly doped n-type silicon. In some embodiments the donor material may be a relatively lightly n-doped wafer 20 as in FIG. 6a, but it will be understood that in this and other embodiments the dopant types can be reversed. Wafer 20 may be doped to a concentration of between about $1\times10^{16}$ and about $1\times10^{18}$ dopant atoms/cm$^3$, for example about $1\times10^{17}$ dopant atoms/cm$^3$. The fact that donor wafer 20 may be reused for some other purpose following exfoliation of one or more laminae makes the use of higher-quality silicon economical. Donor wafer 20 may be semiconductor-grade silicon, rather than solar-grade silicon, for example.

First surface 14 of donor wafer 20 may be substantially planar, or may have some preexisting texture. If desired, some texturing or roughening of first surface 14 may be performed, for example by wet etch or plasma treatment. Surface roughness may be random or may be periodic, as described in Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Methods to create surface roughness are described in further detail in Petti, U.S. Pat. No. 7,915,522, "Asymmetric Surface Texturing For Use in a Photovoltaic Cell and Method of Making," filed May 30, 2008; and in Herner, U.S. Patent Publication No. 2010/0159629 "Method to Texture a Lamina Surface Within a Photovoltaic Cell," filed Dec. 23, 2008, both owned by the assignee of the present application and both hereby incorporated by reference.

One or more regions of opposite conductivity may be formed at and below the first surface 14 of the donor wafer by any method, including diffusion doping. The doped regions have a thickness less than the thickness of the lamina. In some embodiments, for example, the ratio of the thickness of the lamina to the thickness of the doped region may be less than 100:1, such as less than 50:1 or less than 25:1. For example as seen in FIG. 6a, a doped glass layer 52 may be formed on the first surface 14 of the donor wafer 20 by any method such as atmospheric pressure chemical vapor deposition (PCVD). In this example doped glass layer 52 is borosilicate glass (BSG), doped with boron, a p-type dopant. The source gas may be any suitable gas that will provide boron, for example, $BBr_3$, $B_2H_6$, or $BCl_3$. In other embodiments, a dopant-providing material may be spun onto the first surface 14 and baked. In still other embodiments, the doped glass may be grown thermally, by flowing $O_2$ over a solid sources such as BN. The doped glass may have a thickness between, for example, about 500 and about 1500 angstroms, for example, about 1000 angstroms.

Figure 6B:
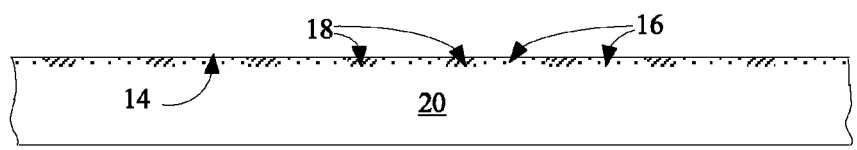

Next, doped glass 52 is removed in selected areas, preferably in a striped pattern, for example by screen printing etchant pasted, to expose first surface 14 in regions between remaining BSG regions 52. One or more regions of the same conductivity but at a higher dopant concentration may also be formed at the first surface 14 of the donor wafer 20. Alternatively, doped regions may be formed on first surface 14 by the deposition of amorphous silicon. As shown in FIG. 6b, heavily doped n-type regions 18 may be formed at and below first surface 14. This may be done by any appropriate method, for example by flowing $POCl_3$ at about 880° C. for about 30 minutes, forming phosphosilicate glass (PSG, not shown) at the exposed regions of first surface 14. An anneal, for example between about 850 and about 1000° C., performed in a furnace from between about 30 and about 90 minutes, diffuses dopants from both the BSG and PSG regions into donor wafer 20 at first surface 14, forming heavily doped p-type regions 16 beneath BSG regions 52 and heavily doped n-type regions 18 between them.

Note that heavily doped n-type regions 18 and heavily doped p-type regions 16 are touching each other. This is acceptable so long as the dopant profiles are optimized accordingly. For example, the boron concentration should only be as high as required to form an effective emitter. This may be achieved by, for example, limiting the temperature of the diffusion step to between about 850 and about 900° C. Next a conventional wet etch, for example an HF dip, removes the BSG and PSG, leaving heavily doped n-type regions 18 and heavily doped p-type regions 16 exposed at first surface 14. Boron and phosphorus are the most commonly used p-type and n-type dopants, respectively, but other dopants may be used.

An alternative process for forming the emitter and base contact regions is as follows: A layer of $Si_3N_4$ may be deposited on a first side of the semiconductor donor body. The wafer may be lightly doped with an n-type conductivity. A screen print etchant paste is applied to etch the $Si_3N_4$ into a stripe pattern. Diffusion doping using a source of phosphorus (e.g., $POCl_3$) is performed to form the n-type base contact regions within the silicon wafer. $Si_3N_4$ is again applied and a stripe pattern, which interleaves the first stripe pattern, is etched. A boron-containing ambient (e.g., $BBr_3$) is used to form the p-type emitter regions in the exposed areas. Any remaining $Si_3N_4$ may be etched off at this time using known methods such as HF. A thin oxide layer may be grown on the wafer.

Figure 6C:
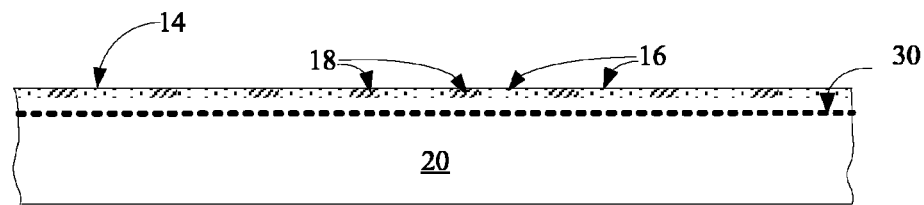

Next, a lamina comprising the emitter and base contact regions is removed from the donor wafer. Exfoliation of a lamina comprising the emitter and base contact regions may occur by any means, including an ion induced cleavage reaction. Gas ions, for example hydrogen and/or helium ions, are implanted through first surface 14 to create cleave plane 30 as shown in FIG. 6c. The cost of this hydrogen or helium implant may be reduced by methods described in Parrill et al., U.S. patent application Ser. No. 12/122,108, "Ion Implanter for Photovoltaic Cell Fabrication," filed May 16, 2008, owned by the assignee of the present invention and hereby incorporated by reference. The overall depth of cleave plane 30 is determined by several factors, including implant energy. The depth of cleave plane 30 can be between about 0.2 and about 100 microns from first surface 14, for example between about 0.5 and about 20 microns, or between about 0.5 and about 50 microns, for example between about 1 and about 25 microns or between about 8 microns and about 20 microns. The depth of the cleave plane will determine the overall thickness of the crystalline portion of the base region of the completed photovoltaic assembly.

Figure 7A:
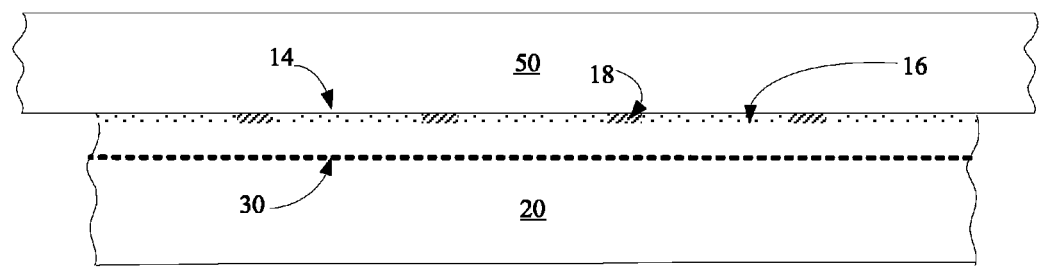
FIGS. 7a through 7c are cross-sectional views illustrating further stages in formation of an embodiment of the present invention.

Next, donor body 20 may be separably contacted to a temporary support element 50 such as a susceptor assembly as shown in FIG. 7a, after the formation of emitter and base contact regions 16 and 18 and after the formation of cleave plane 30. The contact between the donor body and the susceptor assembly may comprise any type of separable force or adherence such as a vacuum, electrostatic or chemical force. In some embodiments the interacting force between the donor body and the susceptor during exfoliation of a lamina is solely the weight of the donor body on the susceptor or solely the weight of the susceptor assembly on the donor body. Following the contacting of the donor body to the susceptor assembly, heat or other force may be applied to the donor body to cleave a lamina from the donor body at the cleave plane. Exfoliation conditions may be optimized to cleave the lamina from the donor body in order to minimize physical defects in a lamina exfoliated in the absence of a permanently adhered support element. Exfoliation may be performed at temperatures between, for example, about 350 and about 650 degrees C. In general exfoliation proceeds more rapidly at higher temperature.

Figure 7B:
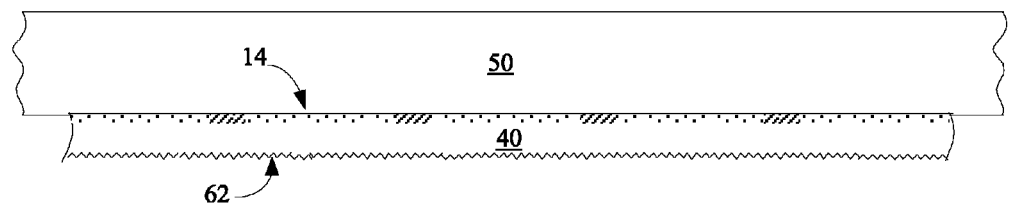

In cleaving lamina 40 from donor wafer 20 at cleave plane 30, a second surface 62 opposite the first surface 14 is created, as shown in FIG. 7b. Heavily doped p-type emitter regions 16 and heavily doped n-type base contact regions 18 are located at and below first surface 14. The lamina may be annealed to remove any damage caused by the hydrogen implantation.

Figure 7C:
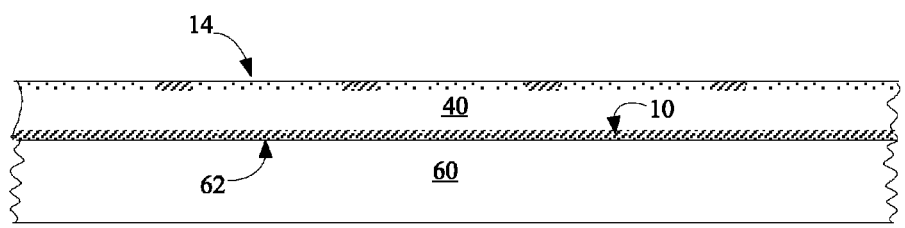

The lamina may be temporarily contacted at either the first surface 14 or second surface 62 with a temporary support element for further processing at this time. When the lamina is contacted at the first surface with a temporary support element, an additional texturing step may be performed at the second surface by any method. Such a step would be desirable if a texturing step was not performed prior to implant. Such a texturing step may serve to remove damage at second surface 62. A specific damage-removal step may be performed, for example by etch or plasma treatment. Damage removal and texturing may be combined into a single step, or may be separate steps. Second surface 62 may be heavily doped to some depth to the same conductivity type as wafer 20, forming heavily doped region 10; in this example, heavily doped region 10 is n-type as shown in FIG. 7c. This region will produce an electric field, which will repel minority carriers from the second surface 62, reducing recombination there and thus increasing the cell's efficiency. This doping step can be performed by any conventional method, including the diffusion doping step described above for the base contact regions, provided the temporary support element can withstand the required temperatures. Any conventional n-type dopant may be used, such as phosphorus or arsenic. Dopant concentration may be as desired, for example at least $1 \times 10^{18}$ dopant atoms/$cm^3$, for example between about $1 \times 10^{18}$ and $1 \times 10^{21}$ dopant atoms/$cm^3$.

Figure 8A:
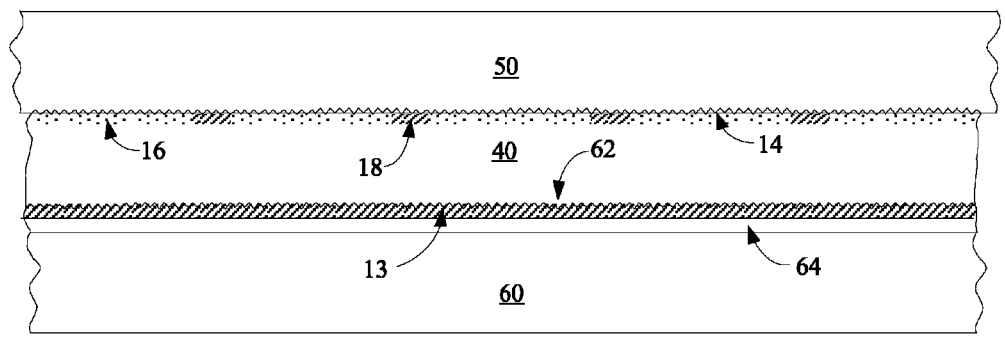
FIGS. 8a and 8b are cross-sectional views illustrating stages in formation of another alternative embodiment of the present invention.

Doping and texturing can be performed in any order, but since most texturing methods remove some thickness of silicon, it may be preferred to form heavily doped n-type region 10 following texturing. Doping is followed by conventional deglazing. Alternatively a layer of amorphous silicon 13 comprising an n-type dopant may be deposited on surface 62 as shown in FIG. 8a. An intrinsic (undoped) layer of amorphous silicon may be interposed between the doped amorphous silicon layer 13 and surface 62 (not shown).

In some embodiments, an antireflective coating (ARC) 64 layer is formed on second surface 62 or on layer of amorphous silicon 13 as depicted in FIG. 8a. Any suitable material may be used for the ARC, such as silicon nitride, which may be, for example, between about 700 and about 800 angstroms thick. In other embodiments silicon dioxide may be used for the ARC, or the ARC may be a stack of silicon nitride and silicon dioxide. As will be seen, this layer will bond to glass; it may be found that a thin layer of silicon dioxide, for example about 200 angstroms, formed on a silicon nitride layer may aid bonding. Both ARC 64 and the optional silicon dioxide layer may be formed by plasma enhanced chemical vapor deposition (PECVD), in general at temperatures around 350° C. or less. Alternatively, the ARC layer may be a transparent conducting material, which may aid in transporting photogenerated carriers to the base contact region. Such a material could be, for example, indium tin oxide or indium zinc oxide, of a thickness between 700 and 1000 Å thick, deposited by physical vapor deposition. With the ARC 64 disposed between them, the receiver element 60 and the lamina 40 are attached together, as shown in FIG. 8a, for example by anodic bonding, or thermo-compression bonding, or bonding with an adhesive.

Figure 8B:
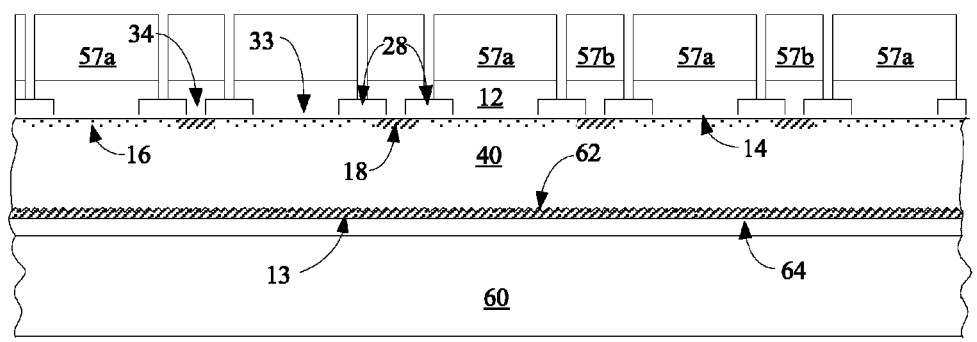

The receiver element 60 serves as a superstrate in the completed cell and thus must be transparent. Any suitable transparent material may be used for the receiver element, such as transparent plastic, soda-lime glass, or a heat-resistant glass such as borosilicate glass. In some embodiments a transparent receiver element 60 may be formed upon surface 62 such as the polymerization of a transparent plastic material. In one embodiment, receiver element 60 may have a longest dimension that is no more than about 10 or 20 percent more than the longest dimension of first surface 10 of wafer 20. Next a dielectric layer, for example silicon nitride 28, is deposited on first surface 14, for example by PECVD as shown in FIG. 8b. The thickness of layer 28 may be as desired, for example about 1000 angstroms. Openings 33 and 34 are formed in silicon nitride layer 28 by any suitable method. In some embodiments these openings are formed using screen print resist followed by etching, or screen print etch paste. Each opening 33 exposes a central portion of one of the heavily doped p-type regions 16, while each opening 34 exposes a central portion of one of the heavily doped n-type regions 18.

Next electrical contact will be made to heavily doped n-type contact regions 18 and heavily doped p-type contact regions 16. Metal layer 12 is deposited, for example by sputtering, onto silicon nitride layer 28 and the portions of heavily doped p-type contact regions 16 exposed in openings 33 and heavily doped n-type contact regions 18 exposed in openings 34. Metal layer 12 will serve as a reflector at the back of lamina 40 in the completed photovoltaic cell, so the material used is preferably a good reflector. For example, metal layer 12 may be aluminum or silver, or may be a stack of metals, for example aluminum and titanium nitride or titanium tungsten. Gaps are formed in metal layer 12 by any suitable method, such as screen print resist paste or etch paste. Finally wiring is formed, for example by electroplating copper, after deposition of a suitable barrier layer and seed layer. Following electroplating, a solderable layer may be formed on the copper, as will be understood by those skilled in the art. Fingers 57a contact p-doped regions 16, while fingers 57b contact n-doped regions 18. To improve resistance, wiring 57a and 57b may be relatively thick (thickness here refers to the dimension perpendicular to second surface 62), for example about 40 microns.

Figure 9A:
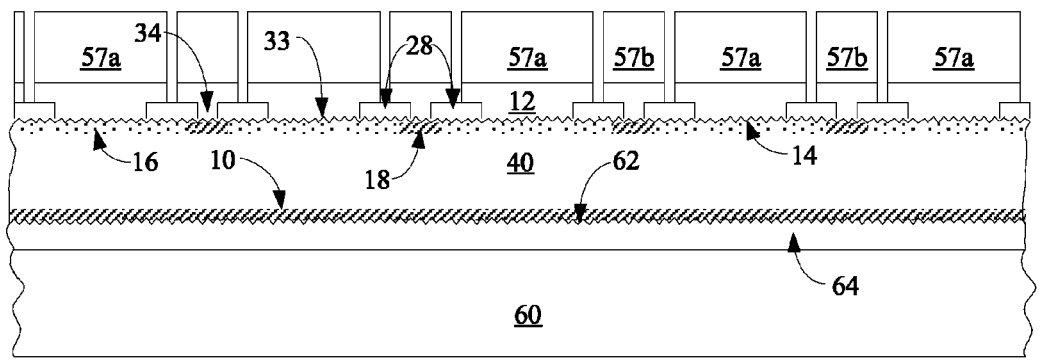
FIGS. 9a and 9b are cross-sectional and plan views of a submodule formed according to an embodiment of the present invention.
Figure 9B:
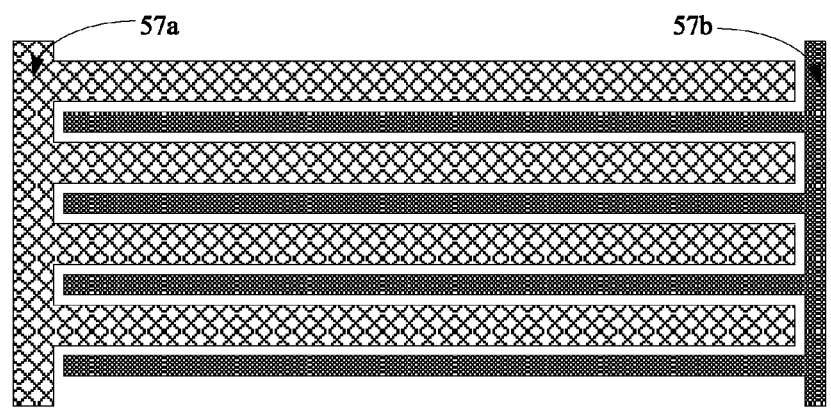

In the completed photovoltaic cell shown in FIG. 9a, heavily doped p-type contact regions 16 behave as the emitter of the cell. A p-n junction exists between each heavily doped p-type contact region 16 and the base region of the cell, which is the remainder of lightly n-doped lamina 40. Heavily doped n-type regions 18 serve as contacts to the base region. Wiring 57a and 57b may be in the form of interdigitated fingers, with fingers 57a contacting p-doped regions 16, and fingers 57b contacting n-doped regions 18 as shown in FIG. 9b.

Surface dimensions of doped regions 16 and 18 may be selected based on their function, and may vary depending on various cell characteristics, including the thickness of the lamina, the resistivity of the base region, the methods used to form features, etc. Generally the emitter regions, heavily doped p-type regions 16, will be wider than the contact regions 18. This may be preferred for a variety of reasons, including the fact that narrower contact regions will decrease the maximum travel distance for minority carriers, thus maximizing the number of generated minority carriers that are collected. For example, in a completed cell, a hole generated in the base region near first surface 10 across from the midpoint of an n-doped contact region 18 must travel laterally half of the width of the base contact region, which is typically much greater than the lamina thickness, to be collected as photocurrent at one of adjacent p-doped contact regions 16. The longer this distance, the higher the probability that the hole will recombine before it can reach wiring 57. In one embodiment, the surface width of heavily doped n-type regions 18 is about 280 microns, while width of heavily doped p-type regions 16 is about 1320 microns, for a pitch of about 1600 microns. The gaps in silicon nitride layer 28 exposing n-type regions 18 may be about 120 microns wide, while gaps in silicon nitride layer 28 exposing p-type regions 16 may be about 920 microns wide. The width of fingers 57a contacting p-doped regions 16 may be about 280 microns, the width of fingers 57b contacting n-doped regions 18 may be about 1020 microns, with gaps of about 120 microns separating them. Clearly these are only examples, and dimensions may be changed as desired.

EXAMPLE 2

Emitter and Base Contact Formed after Cleaving

Figure 11A:
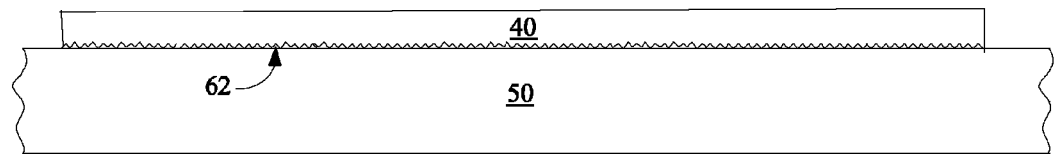
FIGS. 11a through 11d are cross-sectional views illustrating stages in formation of another alternative embodiment of the present invention.
Figure 11B:
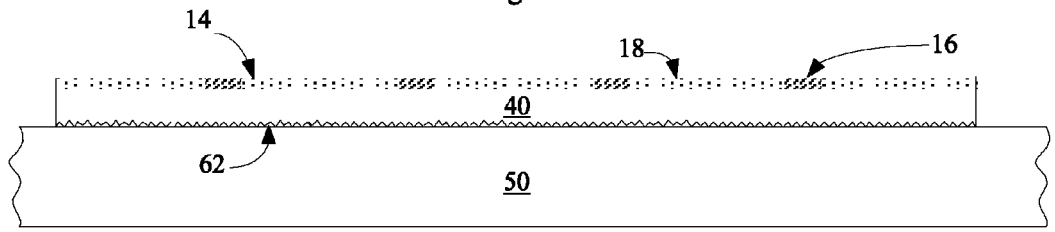

In some embodiments, free standing lamina 40 may be separably contacted to a support element such as susceptor assembly 50 as shown in FIG. 11a before the formation of contact regions 16 and 18. One aspect of this invention is that emitter and base contact regions may be formed on any lamina of any thickness, such as less than 50 μm thick. Another aspect of this invention is that imperfections in the lamina that may have been generated by the exfoliation process may be repaired before the fabrication of emitter and base contact elements. The thin lamina may be fragile and support may be provided by separable contact with support element 50 such as a susceptor assembly as described above. The temporary support element may be a modified electrostatic chuck or other device capable of withstanding elevated temperatures, (i.e., greater than 600, 700, or 800° C.). FIG. 11b depicts base contact region 16 and emitter region 18 formed at and below the surface 14 of freestanding lamina 40 that is separably bound to a temporary support element. After the formation of emitter and base contact regions on the first side of lamina, in the manner of Example 1, temporary support element 50 may be removed and replaced by a receiver element such glass or other transparent material attached to second surface 62.

Figure 11C:
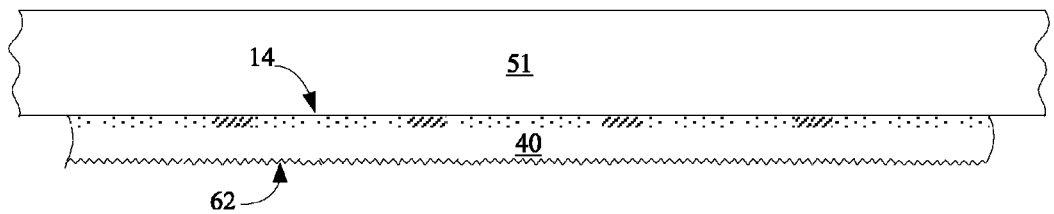
Figure 11D:
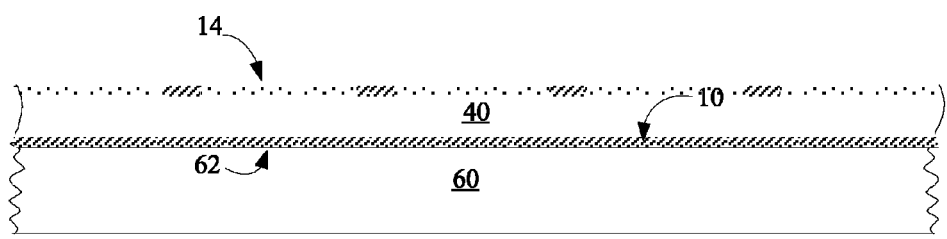

In some embodiments the lamina may be transferred from contact with a first temporary support element 50 on second surface 62 to contact with a second temporary support element 51 in contact with first surface 14 (FIG. 11*c*). From this configuration a receiver element 60 may be contacted or constructed onto second surface 62 of the lamina as in FIG. 11*d*. In yet another alternative embodiment, the lamina may be permanently bound to a receiver element comprised of materials capable of withstanding conditions employed for forming the contact regions such as temperatures greater than 700 or 800° C., such as borosilicate glass, directly after cleaving. For all of these embodiments, metallization proceeds after permanent bonding in the manner of example 1.

EXAMPLE 3

The order of the fabrication of a photovoltaic assembly may vary. In some embodiments, the metallization of the first surface occurs before the formation of a surface field on the second surface. In other embodiments, the order of steps is reversed. The flexibility in the order of these steps provided by this invention allows for a wider variety of process steps to be utilized in the manufacture of the solar cell assembly.

For example, a process may be performed on a donor wafer as in Example 1, up to and including the cleaving step. At this point, the temporary carrier is attached to the second, newly exposed, surface. The dielectric deposition and metallization steps described in both Examples 1 and 2 above are then performed on the first surface, which contains the emitter and base contacts. A second temporary carrier is then attached to the metalized surface, and the first temporary carrier is removed, exposing the first surface of the lamina. The steps removing damage, texturing, and forming the front-surface field and ARC layers, described in Example 1, are then performed. At this point, the cell may be tested by contacting the metallization from the sides. The cell can then be affixed to a permanent transparent carrier, and the second temporary carrier is removed. Multiple cells could be affixed to the same permanent transparent carrier, which would then function as a cover sheet for a photovoltaic module.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to fabricate a photovoltaic device, the method comprising the steps of:
   a) providing a semiconductor donor body doped with a first conductivity type, the semiconductor donor body comprising a first dopant concentration and a first surface;
   b) forming a first contact region at the first surface and within the semiconductor donor body, wherein the first contact region has the first conductivity type at a second dopant concentration, the second dopant concentration being higher than the first dopant concentration;
   c) forming a second contact region at the first surface and within the semiconductor donor body, wherein the second contact region is doped with a second conductivity type;
   d) implanting ions into a depth from the first surface of the semiconductor donor body to define a cleave plane, after the steps of forming the first contact region and forming the second contact region;
   e) cleaving a lamina from the donor body at the cleave plane, wherein the step of cleaving the lamina forms a second surface on the lamina opposite the first surface, and wherein the lamina comprises the first and second contact regions;
   f) contacting the first surface of the lamina to a temporary support; and
   g) fabricating a photovoltaic device, wherein the lamina comprises a base of the photovoltaic device.

2. The method of claim 1 wherein the cleaving step occurs after the steps of forming the first contact region and forming the second contact region.

3. The method of claim 1 wherein the lamina has a thickness between the first and second surfaces, and wherein the thickness is between about 0.5 and about 20 microns.

4. The method of claim 1 further comprising the step of contacting a receiver element to the second surface of the lamina.

5. The method of claim 4 wherein contacting the receiver element to the second surface of the lamina occurs before fabricating the photovoltaic device.

6. The method of claim 4 wherein the receiver element is optically transparent.

7. The method of claim 4 wherein the receiver element is glass.

8. The method of claim 1 wherein the semiconductor donor body is a monocrystalline silicon wafer.

9. The method of claim 1 wherein the depth of the cleave plane from the first surface defines the thickness of the crystalline portion of the photovoltaic cell.

10. The method of claim 1 wherein, after the cleaving step, processing temperature does not exceed about 450° C.

* * * * *